(12) United States Patent
Vanden Bossche

(10) Patent No.: US 10,393,781 B2
(45) Date of Patent: Aug. 27, 2019

(54) IMPEDANCE SYNTHESIZER

(71) Applicant: National Instruments Ireland Resources Limited, Dublin (IE)

(72) Inventor: Marc Vanden Bossche, Bornem (BE)

(73) Assignee: National Instruments Ireland Resources Limited, Dublin (IE)

( * ) Notice: Subject to any disclaimer, the term of this patent is extended or adjusted under 35 U.S.C. 154(b) by 0 days.

(21) Appl. No.: 14/434,877

(22) PCT Filed: Jul. 29, 2014

(86) PCT No.: PCT/EP2014/066322
§ 371 (c)(1),
(2) Date: Apr. 10, 2015

(87) PCT Pub. No.: WO2015/018696
PCT Pub. Date: Feb. 12, 2015

(65) Prior Publication Data
US 2016/0139189 A1    May 19, 2016

Related U.S. Application Data

(60) Provisional application No. 61/862,292, filed on Aug. 5, 2013.

(51) Int. Cl.
| | | |
|---|---|---|
| G01R 27/28 | (2006.01) | |
| H04B 17/00 | (2015.01) | |
| G01R 31/28 | (2006.01) | |

(52) U.S. Cl.
CPC ......... *G01R 27/28* (2013.01); *H04B 17/0085* (2013.01); *G01R 31/2822* (2013.01)

(58) Field of Classification Search
CPC .... G01R 27/28; G01R 31/2822; G01N 22/00; G01N 21/3581; G01F 23/284

USPC .......................................... 324/637
See application file for complete search history.

(56) References Cited

U.S. PATENT DOCUMENTS

| | | | | |
|---|---|---|---|---|
| 4,351,060 A | * | 9/1982 | Treiber | H04B 1/586 375/230 |
| 5,253,291 A | * | 10/1993 | Naseer | H04M 3/005 379/399.02 |
| 5,731,965 A | * | 3/1998 | Cheng | H02J 3/01 307/105 |

(Continued)

FOREIGN PATENT DOCUMENTS

WO    WO 2013/020969 A1    2/2013

OTHER PUBLICATIONS

Kantz, et al; "Measuring System for Time-Variant Impedances"; IEEE Transactions on Instrumentation and Measurement; Feb. 1, 2005; pp. 258-263; vol. 54, No. 1; IEEE Service Center, Piscataway, NJ, U.S.

*Primary Examiner* — Christopher P McAndrew
(74) *Attorney, Agent, or Firm* — Meyertons Hood Kivlin Kowert and Goetzel PC; Jeffrey C. Hood

(57) ABSTRACT

The present invention relates to a system for impedance generation comprising
- impedance generation means arranged for receiving an input clock signal and for generating at least one parameter at a frequency derived from the input clock signal,
- impedance tuning means arranged for receiving the at least one parameter, for synthesizing an impedance based on the received at least one parameter and for outputting the synthesized impedance to a device under test.

32 Claims, 3 Drawing Sheets

(56) References Cited

U.S. PATENT DOCUMENTS

| | | | |
|---|---|---|---|
| 6,566,947 B2* | 5/2003 | Gorcea | H03H 11/30 330/103 |
| 6,573,729 B1* | 6/2003 | Poulis | H04B 1/58 324/600 |
| 7,030,627 B1 | 4/2006 | Ashley | |
| 7,057,516 B2* | 6/2006 | Donskoy | A01M 1/026 324/637 |
| 7,135,941 B1* | 11/2006 | Tsironis | H01P 5/04 333/17.3 |
| 7,486,067 B2* | 2/2009 | Bossche | G01R 27/28 324/76.22 |
| 7,496,150 B2* | 2/2009 | Canella | H04B 14/04 375/295 |
| 7,548,069 B2* | 6/2009 | Simpson | G01R 27/28 324/537 |
| 8,095,085 B2* | 1/2012 | Song | H03J 3/06 455/107 |
| 8,344,751 B2* | 1/2013 | Cho | H04L 25/0298 326/30 |
| 2002/0121930 A1* | 9/2002 | Gorcea | H03H 11/30 330/75 |
| 2005/0114427 A1* | 5/2005 | Canella | H04B 14/04 708/800 |
| 2005/0168336 A1* | 8/2005 | Donskoy | A01M 1/026 340/539.11 |
| 2005/0258904 A1* | 11/2005 | Mehr | H03F 3/189 330/305 |
| 2006/0279275 A1* | 12/2006 | Simpson | G01R 27/28 324/750.16 |
| 2007/0194776 A1* | 8/2007 | Bossche | G01R 27/28 324/76.22 |
| 2010/0026315 A1* | 2/2010 | Simpson | G01R 27/28 324/600 |
| 2012/0274752 A1* | 11/2012 | Hashimoto | A61B 1/00009 348/65 |
| 2012/0327016 A1* | 12/2012 | Hristov | G06F 3/0416 345/174 |
| 2013/0321092 A1* | 12/2013 | Simpson | H03H 11/30 333/17.3 |
| 2015/0073749 A1* | 3/2015 | Simpson | G01R 27/28 702/182 |

* cited by examiner

IMPEDANCE SYNTHESIZER

FIELD OF THE INVENTION

The present invention is related to the field of radio frequency (RF) and microwave measurement technology. More precisely, it relates to devices for characterizing a device under test (DUT) under different impedance conditions.

BACKGROUND OF THE INVENTION

Impedance control devices, also called tuners, are devices of which the impedance, presented to the outside world, can be changed. This is done by either manually changing one or more device properties or by changing one or more properties via an electronic means. Such property is also referred to as a parameter of the tuner. The device typically has one port or two ports, but could in principle have more ports. Via the port these devices are connected to the outside world and provide a controllable impedance to the outside world. In most cases a port is a physical connector through which the impedance control device can be connected to another device. However, the port does not need to be limited to a connector. The port defines a boundary between the impedance control device and the outside world. Amongst others, a port can be a pad of an integrated circuit (IC). The impedance range the impedance control device can provide depends on the physical properties of the device.

Impedance control devices are well established in source- and load-pull measurement set-ups or measurement systems. These set-ups are used to determine the impedances to be presented at the input and/or output of a device under test in order to optimize one or more of its performance characteristics, e.g. the delivered output power, power added efficiency and other. In this case the device under test is typically a transistor or an amplifier under test for which the optimal input and output match is determined during amplifier design. These set-ups are also used to characterize the behaviour of devices, e.g. transistors, diodes, amplifiers, mixers etc. under realistic test conditions or to verify and/or improve their model, used in computer aided engineering (CAE) tools.

Impedance tuners can roughly be divided in two different classes, namely active tuning systems and passive tuning systems.

Passive tuning devices are typically based on a mechanical structure, like a probe or resonator that is moved, or by changing stub lengths by shorting diodes, or by changing capacitor values, typically all on one or another transmission line. The position of the probe, consisting of a depth and longitudinal length, is a set of parameters of the impedance tuner that will determine the impedance.

In active tuning the tuner, considered in broad sense, internally generates in one or another way power to influence the signal coming out of the DUT and as such to modify the impedance seen by the DUT. Active impedance tuning systems, in contrast to passive tuning systems, allow generating reflection factors at the device under test (DUT) close to one and even larger, taking advantage of the internal generated power that can compensate for losses.

Two classes of active load pull systems exist: either with open loop or with closed loop.

Active tuners with open loop use a HF source and inject power towards the DUT output in a phase coherent way with the HF source providing the input signal to the device under test. This can be realized in different ways, e.g. by splitting the input source, followed by amplifying or attenuating and phase shifting it, or by using a second source which is controllable in amplitude and phase and phase locked to the source at the input. Power is generated at the DUT output to counteract at a selected frequency the power coming out of the DUT. By setting the level and the phase of the power, generated by that source, an impedance is actively created at the selected frequency. The main drawback is that when the power coming out of the DUT changes, one needs to adapt the power and phase of the source. For this type of tuner it is not possible to set a parameter that directly translates into an impedance. One needs the interaction of the wave coming out of the device under test with the active impedance tuner.

In an active tuner with a closed loop the signal coming out of the DUT is coupled off, filtered at a selected frequency, amplified or attenuated, modified in phase and re-injected towards the DUT. Depending on the filtering bandwidth the impedance value presented by this loop will track variations of the signal coming out of the DUT. For this type of tuner it is possible to determine the loop gain based on the coupler characteristics and the setting of the gain and phase shifts. The latter can be considered as the impedance tuner parameters which determine the impedance provided to the outside world.

Passive tuners, based on moving probes or resonators are typically slow. Active tuners have typically been faster than passive tuners.

Nowadays new tuning solutions are becoming available, which can change the impedance very fast even for passive tuners, e.g. passive tuning based on MEM technology, solid-state technology or active tuning techniques taking advantage of FPGA technology.

Still even using these new tuning solutions the characterization of components is a tedious time-consuming task because it is not possible to exploit the tuner speed. Typically one steps the input power, steps the source and load impedance and performs these measurements at different bias points and frequency points. This is done using one or another computing device, like a computer, stepping the stimuli, acquiring and collecting all the measurements. As such the speed of applying different stimuli (in general sense, also including applying different impedances) and the speed of measurement and the synchronization between them are primordial to characterize devices very fast. As said this is still very time-consuming as soon as an impedance tuner is present.

Eliminating the tuner from the setup, it is possible to characterize components very fast, taking advantage of the capabilities of arbitrary waveform generators, vector signal generators generating broadband modulation signals in combination with synchronous broadband data acquisition channels and vector signal analyzers.

As soon as tuners are involved, presently one needs to step the tuner through its impedances and for each impedance one needs to perform different sweeps.

Hence, there is a need to extend the impedance tuner such that it possibly can run at its maximal allowable speed changing its impedance values while it can be combined with the regular signal generation means and data acquisition means. In other words, a solution is desirable to extend an impedance tuner so that it will act similar to an arbitrary waveform generator generating impedances as function of time instead of a voltage as function of time.

SUMMARY OF THE INVENTION

It is an object of embodiments of the present invention to provide a system for impedance synthesis as a function of time, which allows changing the impedance of the impedance tuner possibly at its maximum speed, limited by the technology used by the impedance tuner.

The above objective is accomplished by the solution according to the present invention.

In a first aspect the invention relates to a system for impedance generation comprising
- impedance generation means arranged for receiving an input clock signal and for generating at least one parameter at a frequency derived from said input clock signal,
- impedance tuning means arranged for receiving said at least one parameter, for synthesizing an impedance based on said received at least one parameter and for outputting the synthesized impedance to a device under test.

The proposed solution indeed allows for synthesis of impedances as a function of time. By exploiting an externally applied clock signal the at least one parameter is derived as a function of time and said at least one parameter is next used in the impedance tuner to create a corresponding impedance which is applied to the device under test.

In a preferred embodiment the frequency at which the at least one parameter is generated is phase-coherent with the input clock signal.

In a preferred embodiment the system comprises signal generation means for generating at least one stimulus signal to be applied to the device under test and data acquisition means for measuring a response of the device under test to the stimulus signal and the synthesized impedance. Preferably the signal generation means and the data acquisition means are operable at a common frequency derived from the input clock signal.

In another preferred embodiment the impedance generation means is implemented with at least one field programmable gate array.

In yet another embodiment the system comprises storage means for storing a sequence of values of the at least one parameter.

In one embodiment the signal generation means and the impedance generation means are integrated in a single hardware block.

In yet another embodiment the system comprises a smoothing filter arranged for being fed with the synthesized impedance and for applying the filter output to the device under test.

In an advantageous embodiment the at least one parameter is capacitance value or a probe position or a probe height.

In one embodiment the impedance tuning means is implemented as a solid state tuner or as a RF MEMS based tuner or a varactor based tuner.

In another embodiment the impedance tuning means is an active tuner of which the impedance is settable by said received at least one parameter. The impedance tuning means then preferably comprises frequency conversion means.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
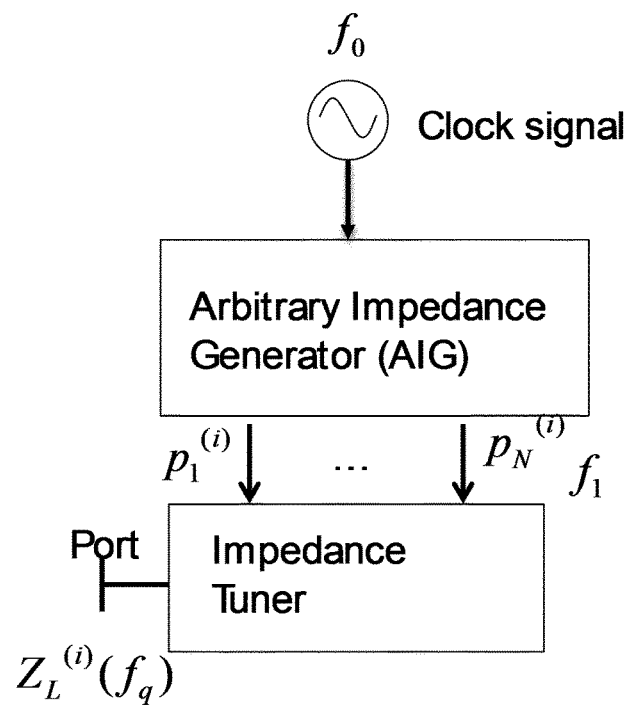
FIG. 1 represents a block diagram of a first embodiment of the present invention.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention aims at a tremendous reduction of the time to characterize components by inventively exploiting the opportunities offered by the present fast tuning technologies, in such a way that the tuner is seamlessly combinable with the broadband modulation signal generation and the signal detection.

An impedance tuner, regardless of whether it belongs to the class of active or passive tuners, synthesizes at least at one frequency $f_q$ an impedance $Z_l$ based on the setting of a series of parameters $\{p_1, \ldots, p_N\}$ with $N \geq 1$. The parameter may be a capacitor value for a tuner based on for example RF MEM technology or a probe height and position for a mechanical tuner. For a tuner based on transmission line stubs with variable length, using diodes to shorten the stubs at different length (solid state tuner), the parameters have a more complex structures but the above formalism is still valid. The considered impedance tuner is not limited to passive tuners. Certain active tuners can synthesize also an impedance based on the settings of one or more parameters. The Arbitrary Impedance Generator (AIG) (FIG. 1) receives an input clock signal $f_0$ and it clocks out possibly at another deterministic frequency $f_1$, derived from the original clock signal at $f_0$, in a given order and possibly in a repeatable way a set of parameters $p_1, \ldots, p_N$ to set or change the impedance of the impedance tuner with these new parameter values. FIG. 1 provides a block diagram. In this way one is generating a time-dependent impedance or reflection factor, derived from the clock ($f_0$). This is similar to an arbitrary wave generator that generates a time-dependent output voltage. The derivation of the deterministic frequency $f_1$ from the input clock signal $f_0$ can be done in a phase coherent way, depending on the implementation in the AIG.

The Arbitrary Impedance Generator may comprise a memory that contains a table with the sequence of values of parameters $\{p_1, \ldots, p_N\}$ which is being clocked out based on the input clock signal ($f_0$) or a derivative of this clock ($f_1$).

Instead of using a table, one can use a processing unit or similar means that gets clocked by the external clock ($f_0$) and that at a possibly different deterministic frequency ($f_1$) puts out new parameter values to set or change the impedance. To generate phase coherent time-dependent impedances, the processing unit or similar means must be chosen such that the other frequency ($f_1$) is coherent with the clock signal ($f_0$). This obviously imposes limitations on the selection of the processing unit. A regular computer running a regular desktop operating system would not be adequate. On the other hand, an FPGA can be used as processing unit or a collection of FPGAs that are running synchronously.

Figure 2:
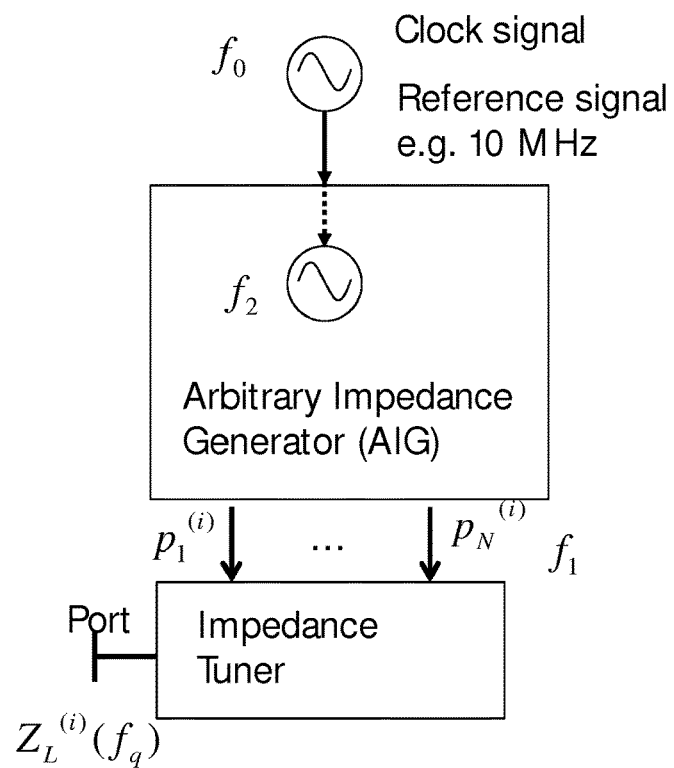
FIG. 2 illustrates another embodiment of the invention.

The clock signal $f_0$ can be a reference clock, e.g. 10 MHz, from which an internal clock at $f_2$ can be generated by a synthesizer means from which the frequency $f_1$ is derived. The reference clock is typically also used to synchronize the signal generators and the data acquisition (FIG. 2).

Figure 3:
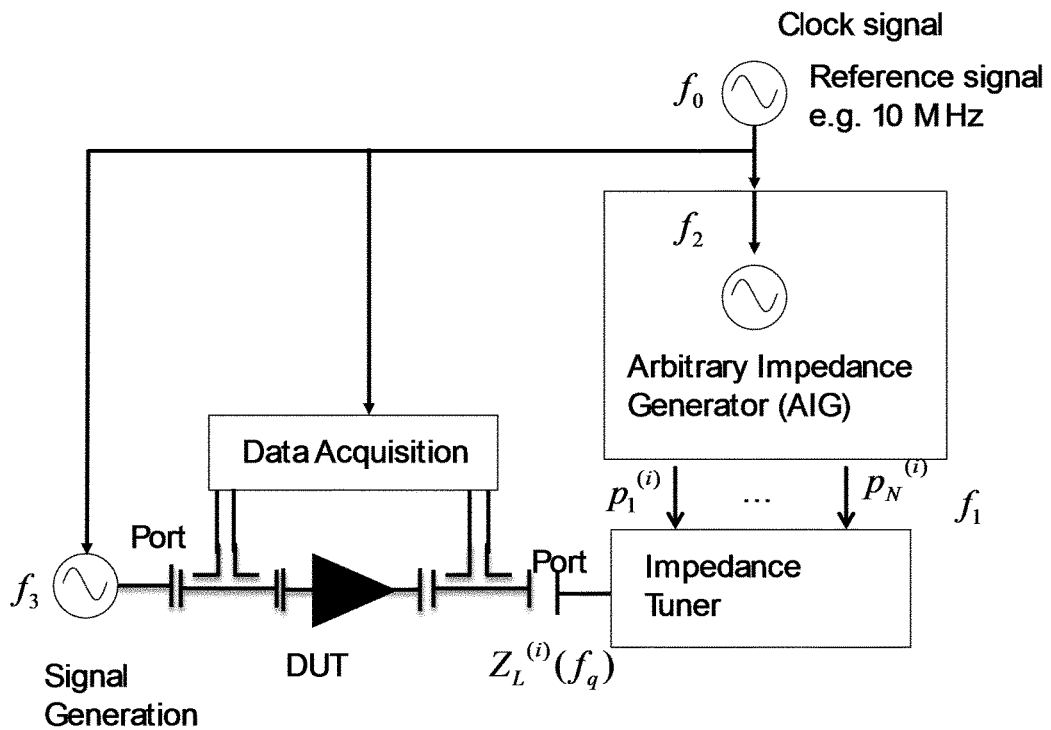
FIG. 3 illustrates an embodiment comprising signal generation and data acquisition.

By synchronizing the AIG with the possible different stimuli the impedance can change as a function of time at a slow rate ($f_1$) compared to the rate of change of the stimulus signal at the input ($f_3$) which can change much faster than the impedance. Synchronizing the data acquisition with the stimuli and the AIG allows scanning different characteristics of a device fast (FIG. 3). The relation of the rate of change between the stimulus signals, e.g. the RF input signal and the bias signal, and the time-dependent impedance can be chosen in different ways.

Figure 4:
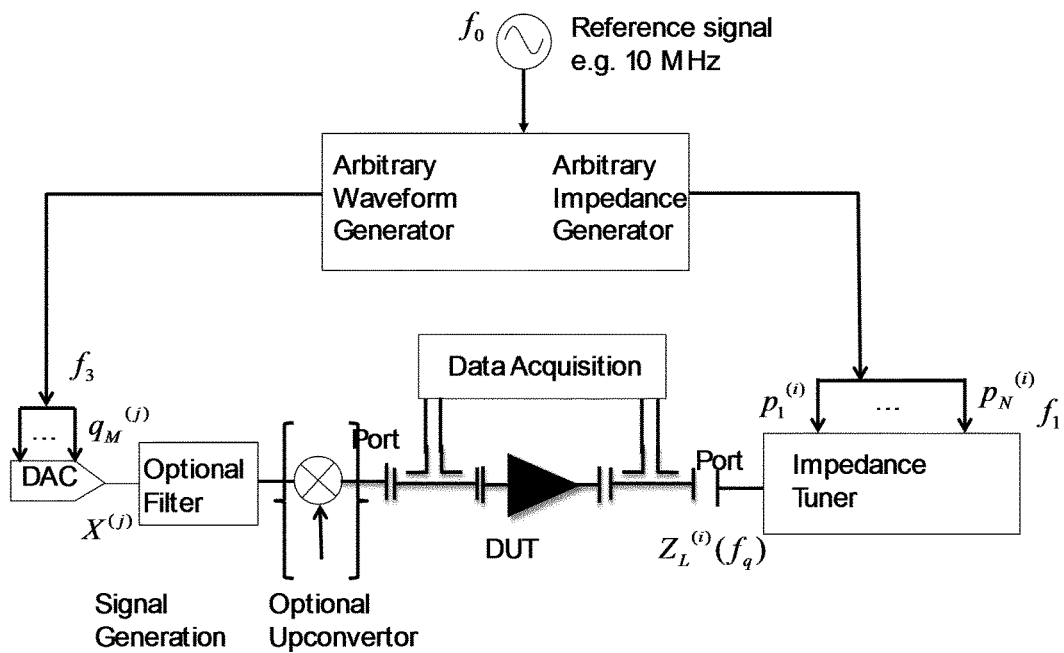
FIG. 4 represents an embodiment with integrated waveform generator and impedance generator.

In a further embodiment the hardware used to synthesize arbitrary waveform signals can be combined with the hardware used to generate arbitrary impedances. As such there is one reference clock used for both and both are set synchronously by a set of parameters (FIG. 4).

The combination of AWG and AIG can be implemented on a FPGA or a combination of FPGAs running synchronously.

Figure 5:
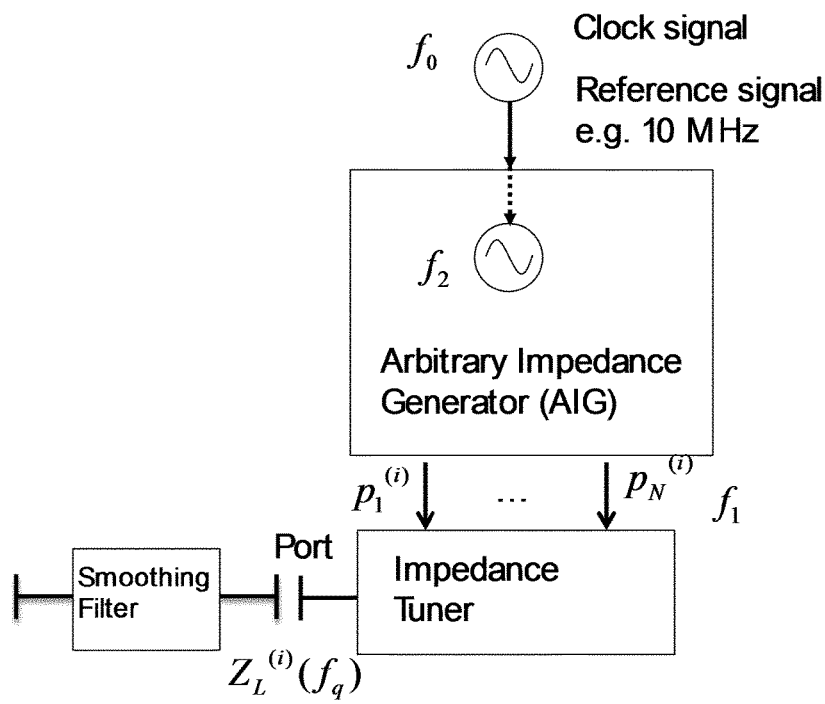
FIG. 5 illustrates an embodiment with a smoothing filter connected to the impedance tuner output.

The impedance tuner can be followed by a filter which operates as a kind of reconstruction filter, well known from arbitrary waveform generators (FIG. 5). In a similar way as arbitrary waveform generators which use anti-alias filters to smooth the output signal or to limit the frequency content, the impedance tuner going from impedance value to another impedance value can be smoothened by adding a smoothing filter.

Figure 6:
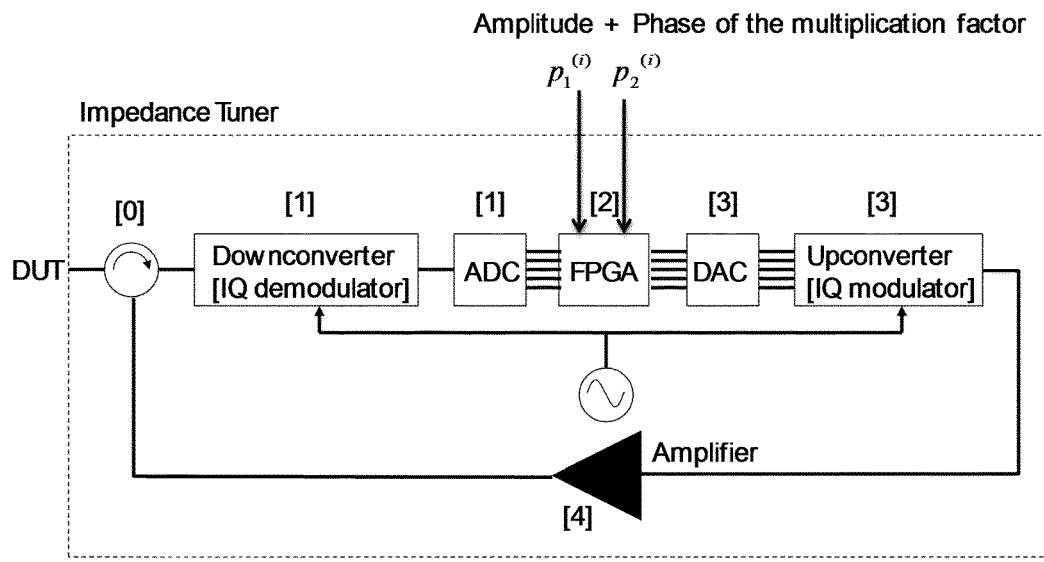
FIG. 6 illustrates an embodiment with an active impedance tuner comprising frequency conversion means.

As stated above, for the actual implementation of the Impedance tuner different options are available. One possible solution is a solid-state tuner (using diode technology). In another embodiment devices based on RF MEMS or varactors are tuned. Alternatively, an active impedance tuning device can be used. In FIG. 6 an active tuner is illustrated that downconverts the signal coming from the device under test, filters the downconverted signal, changes its amplitude and phase depending on the parameters set, upconverts the signal again and sends it to the device under test. The value of the impedance synthesized is in combination with the characteristics of the fixed hardware determined by the parameters set.

Also for implementing the arbitrary impedance generator various options are available. One solution is to employ a single FPGA. Alternatively, one FPGA is applied for signal synthesis and one FPGA for impedance synthesis while making sure the two FPGAs run fully synchronous. Further also the use of an ASIC or a DSP engine can be envisaged.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A system for time-dependent impedance generation, the system comprising:
   impedance generation means arranged for:
      receiving an input clock signal;
      generating at least one parameter that changes as a function of time; and
      outputting the at least one parameter, clocked at an output frequency derived from said input clock signal, and
   impedance tuning means arranged for:
      receiving said at least one parameter;
      synthesizing an impedance based on said received at least one parameter; and
      outputting the synthesized impedance to a device under test.

2. The system of claim 1, wherein said output frequency is phase-coherent with said input clock signal.

3. The system of claim 1, comprising signal generation means for generating at least one stimulus signal to be applied to said device under test and data acquisition means for measuring a response of said device under test.

4. The system of claim 3, wherein said signal generation means and said data acquisition means are operable at a common frequency derived from said input clock signal.

5. The system of claim 1, wherein said impedance generation means is implemented with at least one field programmable gate array.

6. The system of claim 1, comprising storage means for storing a sequence of values of said at least one parameter.

7. The system of claim 3, wherein said signal generation means and said impedance generation means are integrated in a single hardware block.

8. The system of claim 1, comprising a smoothing filter arranged for being fed with said synthesized impedance and applying the filter output to said device under test.

9. The system of claim 1, wherein said at least one parameter is capacitance value or a probe position or a probe height.

10. The system of claim 1, wherein said impedance tuning means is implemented as a solid state tuner or as a RF MEMS based tuner or a varactor based tuner.

11. The system of claim 1, wherein said impedance tuning means is an active tuner of which the impedance is settable by said received at least one parameter.

12. The system of claim 11, comprising frequency conversion means.

13. A system for synthesized impedance generation, the system comprising:
   an impedance generator configured to:
      receive an input clock signal;
      generate at least one parameter that changes as a function of time; and
      output the at least one parameter, clocked at an output frequency derived from the input clock signal; and
   an impedance tuner configured to:
      receive the at least one parameter;
      synthesize an impedance based on the received at least one parameter; and
      provide the synthesized impedance to a device under test.

14. The system of claim 13, wherein the output frequency is phase-coherent with the input clock signal.

15. The system of claim 13, further comprising:
   a signal generator configured to generate at least one stimulus signal to be applied to the device under test; and
   data acquisition circuitry configured to measure a response of the device under test.

16. The system of claim 15, wherein the signal generator and the impedance generator are integrated in a single hardware block.

17. The system of claim 15, wherein the signal generator and the data acquisition circuitry are configured to operate at a common frequency derived from the input clock signal.

18. The system of claim 13, wherein the impedance generator is implemented with at least one field programmable gate array.

19. The system of claim 13, further comprising a memory element configured to store a sequence of values of the at least one parameter.

20. The system of claim 13, further comprising a smoothing filter having an input configured to receive the synthesized impedance and an output configured to provide a filtered version of the synthesized impedance to the device under test.

21. The system of claim 13, wherein the at least one parameter is one of:
   a capacitance value;
   a probe position; or
   a probe height.

22. The system of claim 13, wherein the impedance tuner is implemented as one of:
   a solid state tuner;
   a radio frequency mechanical system based tuner; or
   a varactor based tuner.

23. The system of claim 13, wherein the impedance tuner is an active tuner having an impedance settable by the received at least one parameter.

24. A method for synthesizing an impedance, the method comprising:
   generating at least one parameter that changes as a function of time;
   outputting the at least one parameter, clocked at an output frequency derived from an input clock signal having a reference frequency;
   synthesizing an impedance based on the at least one parameter; and
   providing the synthesized impedance to a device under test.

25. The method of claim 24, wherein the output frequency is phase-coherent with the input clock signal.

26. The method of claim 24, further comprising:

generating at least one stimulus signal to be applied to the device under test; and measuring a response of the device under test.

27. The method of claim 26, wherein said generating the at least one parameter and said generating the at least one stimulus signal are performed on a single hardware circuit.

28. The method of claim 26, further comprising performing said generating the at least one parameter and said measuring the response of the device under test according to a common frequency derived from the input clock signal.

29. The method of claim 24, further comprising:

storing a sequence of values of the at least one parameter.

30. The method of claim 24, further comprising:

filtering the synthesized impedance; and providing the filtered version of the synthesized impedance to the device under test.

31. An impedance synthesizer system, the system comprising:

a first hardware block configured to:

derive a first signal having a first frequency from a reference signal having a reference frequency, wherein the first signal is phase coherent with the reference signal;

generate a set of parameters as a function of time, wherein at least some parameters of the set of parameters differ in value from each other; and output the set of parameters, clocked according to the first signal; and a second hardware block configured to:

synthesize an impedance based on at least one parameter of the set of parameters; and provide the synthesized impedance to a device under test.

32. The system of claim 31, further comprising:

first circuitry configured to generate and apply at least one stimulus signal to the device under test; and second circuitry configured to measure a response of the device under test.

* * * * *